United States Patent
Xu et al.

Patent Number: 6,070,252
Date of Patent: May 30, 2000

[54] METHOD AND APPARATUS FOR INTERACTIVE BUILT-IN-SELF-TESTING WITH USER-PROGRAMMABLE TEST PATTERNS

[75] Inventors: Yan Xu, Phoenix, Ariz.; Murtuza Ali Lakhani, Penang, Malaysia

[73] Assignee: Intel Corporation, Santa Clara, Calif.

[21] Appl. No.: 08/698,465

[22] Filed: Aug. 15, 1996

Related U.S. Application Data

[63] Continuation of application No. 08/315,907, Sep. 30, 1994, abandoned.

[51] Int. Cl.[7] .................................................. G06F 11/27
[52] U.S. Cl. ........................... 714/30; 714/726; 714/733; 714/734
[58] Field of Search .................................. 371/22.1, 22.2, 371/22.3, 22.4, 22.5, 22.6, 24, 25.1, 26, 27, 21.1, 21.2, 21.3, 22.31; 395/183.06, 183.05, 183.07, 183.01

[56] References Cited

U.S. PATENT DOCUMENTS

| | | | |
|---|---|---|---|
| 4,764,926 | 8/1988 | Knight et al. | 371/22.5 |
| 5,173,906 | 12/1992 | Dreibelbis et al. | 371/22.5 |
| 5,325,367 | 6/1994 | Dekker et al. | 371/21.1 |
| 5,355,369 | 10/1994 | Greenberger et al. | 371/22.3 |
| 5,416,784 | 5/1995 | Johnson | 371/22.5 |
| 5,525,971 | 6/1996 | Flynn | 340/825.06 |
| 5,557,619 | 9/1996 | Rapoport | 371/21.2 |
| 5,596,734 | 1/1997 | Ferra | 395/825 |
| 5,627,842 | 5/1997 | Brown et al. | 371/22.3 |
| 5,809,036 | 9/1998 | Champlin | 371/22.31 |
| 5,978,945 | 11/1999 | Muris | 714/727 |

*Primary Examiner*—Robert W. Beausoliel, Jr.
*Assistant Examiner*—Scott T. Baderman
*Attorney, Agent, or Firm*—Blakely, Sokoloff, Taylor & Zafman LLP

[57] ABSTRACT

Methods and apparatus for interactive built-in self-testing with user-programmable test patterns are disclosed. The present invention operates in the context of an integrated circuit (IC) including built-in self-test (BIST) logic and a test interface circuit resident on the IC. The BIST logic executes a BIST routine for testing the IC, and the test interface achieves the inputting of an external test pattern into the BIST logic from an external logic circuit. The test interface includes a first flag storage element accessible to the BIST logic. The first flag storage element stores a first flag that indicates whether the test pattern will be provided to the IC from the external logic. A test data storage element in the test interface stores the external test pattern, and is also accessible to the BIST logic. A second flag storage element accessible to the BIST logic stores a second flag to indicate whether the test pattern is available in the test data storage element. Test control logic receives a first instruction from the external logic, and executes the first instruction to set the first flag. The test control logic reads the test pattern and sets the second flag after the test pattern is stored in the test data storage element. If the first flag is not set, the BIST logic executes the BIST routine using a test pattern internally generated on the IC. On the other hand, if the first flag is set, then the BIST logic executes the BIST routine using the test patterns stored in the test data storage element.

6 Claims, 6 Drawing Sheets

METHOD AND APPARATUS FOR INTERACTIVE BUILT-IN-SELF-TESTING WITH USER-PROGRAMMABLE TEST PATTERNS

This is a continuation of application Ser. No. 08/315,907, filed Sep. 30, 1994, now abandoned.

BACKGROUND OF THE INVENTION

1. Field of the Invention

The present invention relates to the field of circuit testing, and more particularly to the test patterns used by a built-in self-test (BIST) routine in a microprocessor.

2. Prior Art

Conventional methods for testing digital logic circuit boards have become steadily less effective as integrated circuits mounted on the boards have both shrunk in size and grown in complexity. Test techniques that became popular in the 1980s, notably in-circuit testing, depend on the ability to make contact with circuit connections internal to a loaded board. Such techniques include the use of hand-held diagnostic probes and so-called "bed-of-nails" fixtures. Unfortunately, these techniques are difficult to implement in the face of the high board density of surface-mounted devices, particularly when applied to double-sided boards.

One technique, functional testing, relies primarily on stimulating a loaded board at its input and observing its output. As integrated circuits become more complex, it becomes more difficult to generate tests that will exercise them fully from the board edge connector that serves as the input for the test. Test data must propagate through a number of complex chips to reach those only remotely coupled to the input. As a consequence, long test sequences are required to reach these remote chips, making functional testing not optimally effective.

Similarly, as integrated circuits become more complex, it becomes more difficult to test units within the integrated circuit itself by applying signals from the external IC pins. The bottom line is that, with respect to both circuit boards and the ICs themselves, increasing amounts of circuitry must be tested through a relatively constant number of external interfaces.

To address this problem, manufacturers have incorporated IEEE standard test access ports (TAP) into their chips. The TAP is used for boundary-scan testing in which a shift register path is incorporated into an IC between each pin and the logic inside the chip. This technique permits test patterns to be shifted in through the input pins of the chip, and the state of the chip in response to the input to be observed at the output pins in a single-step mode. When the IC is put into test mode, the data loaded into the shift register cells is used instead of the data flowing to or from the pins, so that either the internal chip logic or the external chip-to-chip connections can be tested.

Although the boundary-scan technique provides access to the input and output pins of an IC, the technique does not permit any access to the complex internal units of the chip. Accordingly, manufacturers have incorporated test equipment for executing a built-in self-test (BIST) directly into the loaded boards and the circuits. This built-in test equipment may be directly integrated into the hardware of the functional units to be tested, or encoded into microcode ROM. The BIST routine can be invoked by asserting a Self-Test pin on the processor or by using a JTAG test access port (IEEE Std 1149.1) to load a RUNBIST instruction to execute the BIST routine.

In a simple implementation, the output of the BIST test is interfaced to the external world through a BIST FAIL pin. In an enhanced implementation, when a circuit fails the BIST, a fail message indicating which functional units failed the test is stored in the processor register file. For further information on BIST for RAM and TAP, please refer to V. C. Alves, M. Nicolaidis, P. Lestrat, B. Courtois, "Built-In Self-Test for Multi-Port RAMs," 1991 IEEE International Conference on Computer-Aided Design Digest of Technical Papers (91CH3026-2), 248–251; C. M. Maunder, R. E. Tulloss, "Testability on TAP," IEEE Spectrum, 34–37 (February 1992).

A number of faults can lead to circuit failure. Some of the more common faults tested by the BIST include the following:

1. Memory cells stuck at 1/0 fault.
2. Memory cell state transition 1-to-0 and 0-to-1 fault.
3. Inter-cell interference (state coupling or cross talk).
4. Multiple access or wrong addressing faults in the decoder.
5. Data retention fault.

As a particular example, the first fault occurs when a memory cell is stuck at one or zero, and does not toggle in accordance with its data input. As another example, cross talk occurs when the state of one cell affects the state of a neighboring cell.

To test these faults, because BIST testing is rather lengthy, manufacturers have incorporated a number of compromises into their BIST implementations. For example, in conventional processors, the BIST routine uses predetermined or randomly generated patterns to fill and test the CPU hardware units, such as the cache. The predetermined test pattern is designed to match only the most common fault models. A drawback of the predetermined pattern approach is that it is designed under the assumption that all memory devices tested by the BIST follow the same memory cell layout. Unfortunately, the relationship between the memory device address lines and the physical location of the memory cells may change. For example, a predetermined test pattern of alternating ones and zeros may be used to detect cross talk (i.e., whether the cells excited by a one data bit affect the state of neighboring cells receiving a zero bit.). This test is effective if sequentially addressed cells are sequentially laid out in the physical chip according to the same sequence. However, if, for example, odd-addressed cells are physically grouped together in one location and even-addressed cells are physically grouped together in another location, then the alternating pattern will not provide an effective test for inter-cell interference.

The random generated pattern is not directed to implementing a particular fault model, but rather is used to obtain a statistical determination of the chip failure rate. One drawback of the random pattern method is that it must be run a number of times to ensure a satisfactory level of statistical certainty as to the accuracy of the test.

A disadvantage of both the predetermined and randomly generated test patterns is that the user has no control over the test pattern used by the BIST routine. As described above, the user can only invoke the BIST program and observe whether the circuit passed or failed, with little additional information provided. In a number of instances, however, the user may desire to modify the test pattern. For example, if the cell layout of a memory device to be tested does not conform to the test pattern embedded in the BIST program, then the user must be able to modify the test pattern applied to the memory cells. Further, the use of unmodifiable patterns prevents the user from pinpointing a particular memory cell causing chip failure.

In the recent past, the size of on-chip memory was relatively small. As a result, a test pattern implementing the most common fault models was highly likely to catch circuit defects. If an error was detected, the chip was simple thrown away. As on-chip memory size and density have increased, however, the need for more sophisticated testing has arisen. For example, the increase in memory capacity also increases the likelihood that relatively uncommon problems (that are not detectable by common fault models) may give rise to chip failure. Thus, a BIST routine based upon a common fault model may not detect a defective chip. In addition to this purely statistical reason for an increase in the relatively less common defects, the increase in circuit density has resulted in extremely fine submicron line spacing, which physically increases the risk of certain faults. A user who is suspicious that a circuit may be exhibiting an uncommon fault would not have the ability to select an appropriate test pattern under the current BIST implementation.

Thus, it can be appreciated that more flexibility in test pattern selection is desired. By allowing the user to modify the test pattern, the user would be able to account for changes in memory cell layout, detect relatively uncommon faults, and pinpoint the location of certain errors. By pinpointing a defective cell in a cache, for example, the user can simply "lock out" the defective portion of the cache, thus avoiding the need to scrap the circuit by accepting a smaller capacity chip.

SUMMARY OF THE INVENTION

The present invention provides methods and apparatus for interactive built-in self-testing with user-programmable test patterns. The present invention operates in the context of an integrated circuit (IC) including built-in self-test (BIST) logic and a test interface circuit resident on the IC. The BIST logic executes a BIST routine for testing the IC, and the test interface of the present invention achieves the inputting of an external test pattern into the BIST logic from an external logic circuit. The test interface includes a first flag storage element accessible to the BIST logic. The first flag storage element stores a first flag that indicates whether the test pattern will be provided to the IC from the external logic. A test data storage element in the test interface stores the external test pattern, and is also accessible to the BIST logic. A second flag storage element accessible to the BIST logic stores a second flag to indicate that the test pattern is available in the test data storage element. Test control logic receives a first instruction from the external logic, and executes the first instruction to set the first flag. The test control logic reads the test pattern and sets the second flag after the test pattern is stored in the test data storage element.

If the first flag is not set, the BIST logic executes the BIST routine using a test pattern internally generated on the IC. On the other hand, if the first flag is set, then the BIST logic executes the BIST routine using the test pattern stored in the test data storage element.

According to the present invention, the test interface circuit may be implemented by employing a JTAG TAP controller. Alternatively, the present invention may use dedicated integrated circuit pins for controlling the input of the external test pattern to the BIST logic.

BRIEF DESCRIPTION OF THE DRAWINGS

The objects, features and advantages of the present invention will be apparent to one skilled in the art in light of the following detailed description in which.

DETAILED DESCRIPTION OF THE INVENTION

The present invention provides methods and apparatus for interactive built-in self-testing with user-programmable test patterns. For purposes of explanation, specific details are set forth to provide a thorough understanding of the present invention. However, it will be understood by one skilled in the art, from reading this disclosure, that the invention may be practiced without these details. Moreover, well-known elements, devices, process steps and the like are not set forth in order to avoid obscuring the invention.

The present invention permits a user to program BIST test patterns through a minor modification of the BIST microcode and implementation of a new protocol to read in the test patterns through either standard test interfaces or using new system pin signals.

Figure 1A:
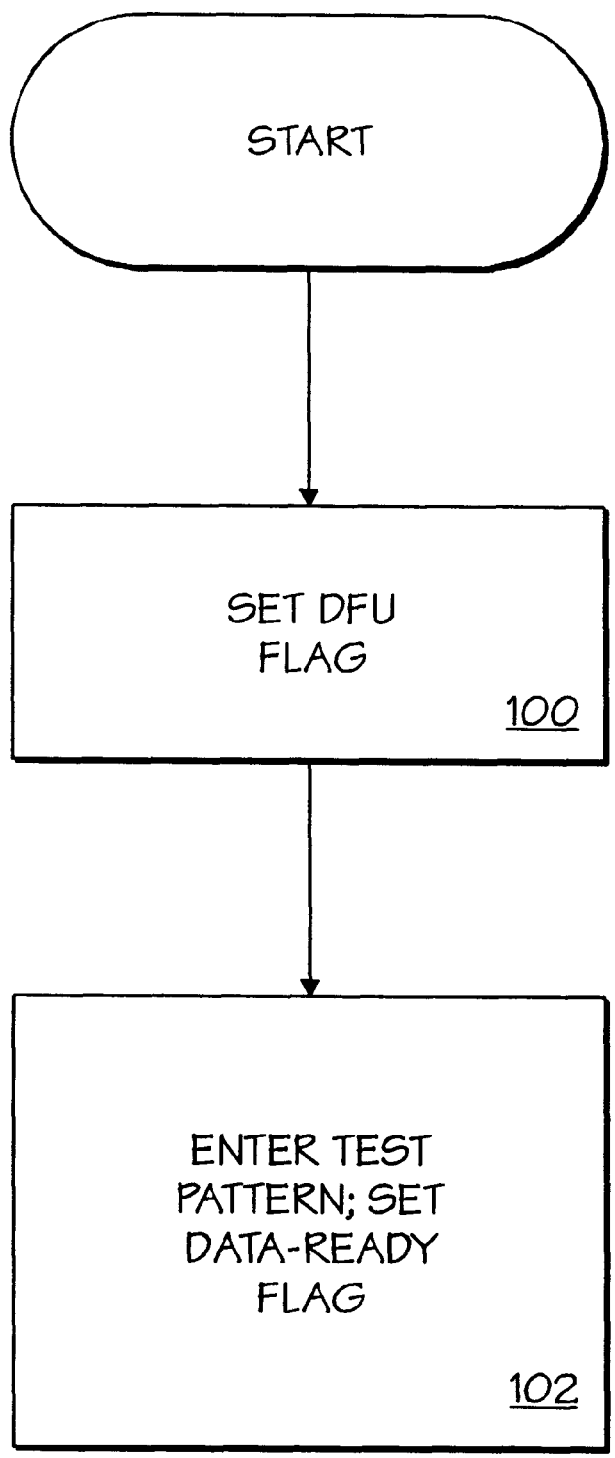
FIGS. 1A and 1B are flow charts diagramming the general process of the present invention.
Figure 1B:
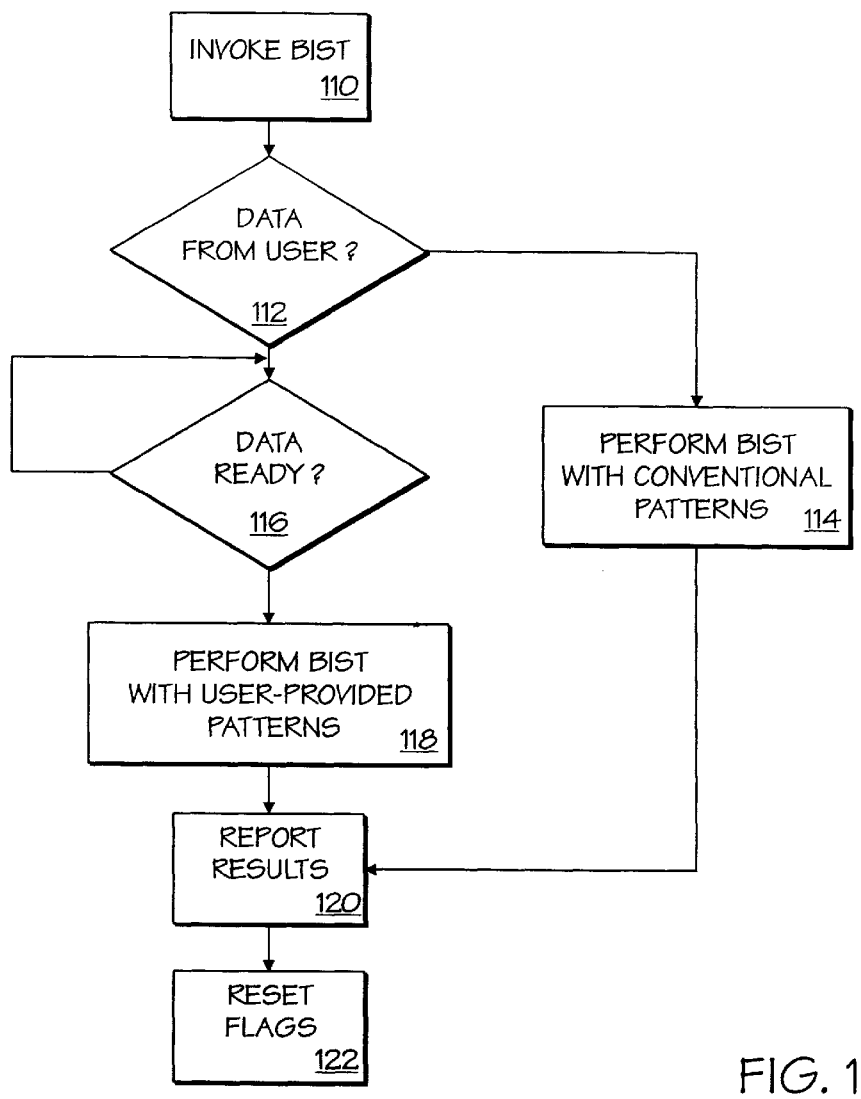

FIGS. 1A and 1B are flowcharts diagramming the general process of the present invention. FIG. 1A preferably exemplifies the actions undertaken by the user or test engineer. Before executing the BIST routine, the user uses external logic residing off-chip (including standard I/O) to initiate the setting of a flag DFU (data from user) indicating that the user will provide the BIST test pattern (step 100). The DFU flag may be stored in any register accessible by the BIST hardware or microcode software (depending upon the BIST implementation). After setting the DFU flag, the user then uses the external logic to feed a user-provided test pattern into another register (BISTPATREG), which is also accessible by the BIST routine (step 102). The reading in of the pattern will also set a DATA_READY flag, which is similarly stored in a BIST-accessible register.

After the flags of the present invention have been set, the BIST program is executed as shown in FIG. 1B. First, the BIST routine is invoked (step 110). This can be achieved by asserting the Self-Test pin, or by feeding a RUNBIST instruction into a JTAG instruction register through the Test Access Port. One skilled in the art will recognize that there are a number of means to invoke the BIST program.

According to the present invention, the BIST routine hardware or microcode is modified to read the DFU and DATA_READY flags, and the user-provided test pattern, according to FIG. 1B. At the front end of the BIST routine, before the test pattern is applied to any memory cells or functional units, the BIST of the present invention tests whether the DFU flag is set (step 112). If it is not set, then the BIST routine runs using the conventional fixed or random patterns (step 114). If, on the other hand, the DFU flag is set, then the BIST routine of the present invention determines whether the DATA_READY flag is set to indicate that the user-selected test pattern in BISTPATREG is available (step 116). If not, the BIST routine will wait until it is available, at which time the BIST routine will select BISTPATREG as the source of the test pattern, and will perform the BIST using the user-provided pattern (step 118).

Figure 2:
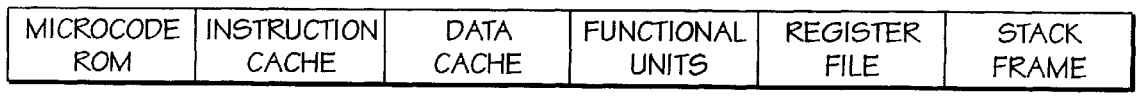
FIG. 2 illustrates a fail message format of the present invention.

After performing the BIST routine, the results are reported (step 120). In one embodiment the reporting of information can occur as follows. Upon detection of a failure in one of the units tested by the BIST, the BIST may pull down the output of the active-low FAIL pin to indicate a failure. The BIST routine also preferably prepares a fail message as formatted in FIG. 2. Each field of the fail message is dedicated to indicating the status of a particular unit subject to testing. In the example of FIG. 2, a bit may be set in any or all of the failure message fields to indicate whether a failure is detected in the microcode ROM, the instruction cache, the data cache, one of the functional units (e.g., floating point or integer execution units), the register file, or the stack frame. One skilled in the art will recognize that the failure message may be used to report the status of any unit within the processor under test. The BIST routine preferably writes the failure message into a memory-mapped, dedicated register in the CPU core that is accessible to the user through normal read operations. Alternatively, the failure message may be read out through a standard test interface, such as JTAG. After detecting a failure through the FAIL pin of the CPU, the user may read the failure message and display it or store it in external memory.

Upon completion of the testing by the BIST routine, the BIST program or BIST hardware resets the DFU and DATA_READY flags (step 122).

The present invention of FIGS. 1A and 1B may be implemented according to a number of embodiments. Two specific embodiments—using the JTAG test interface, and dedicated system pin signals—are disclosed herein. One skilled in the art will recognize that the present invention is not limited to the following embodiments.

JTAG

Figure 3:
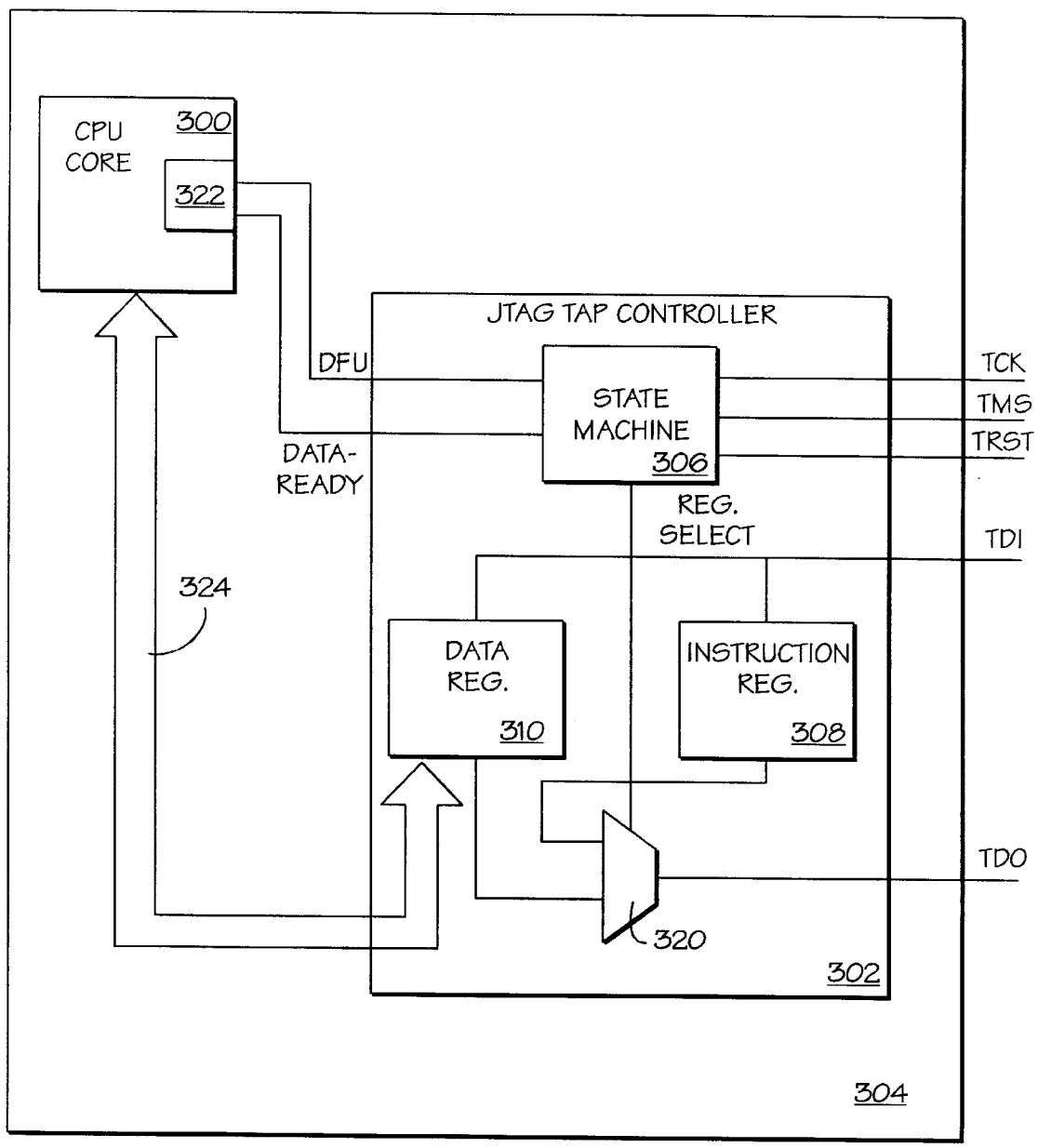
FIG. 3 illustrates the present invention employing a JTAG TAP controller.
Figure 4:
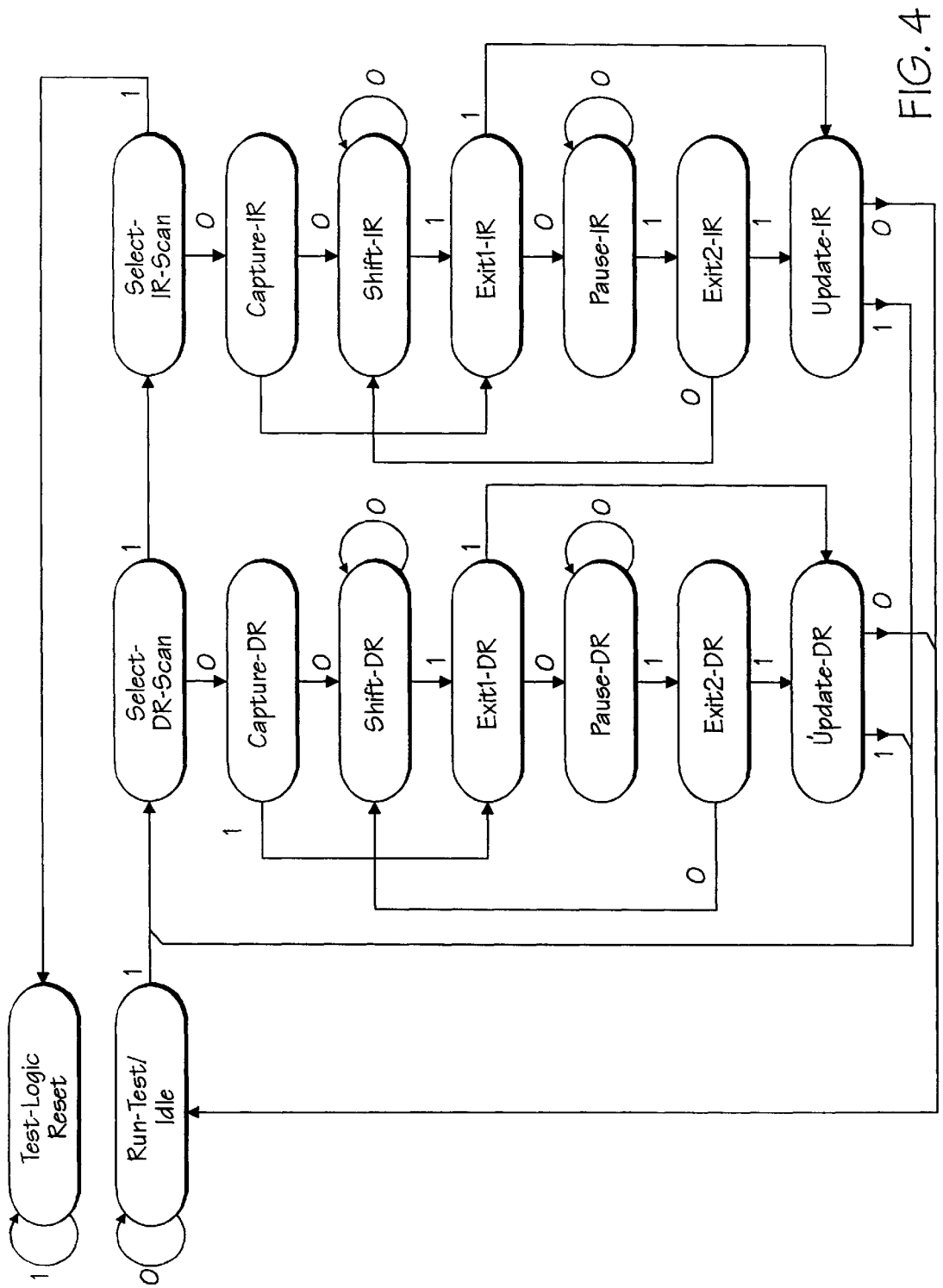
FIG. 4 illustrates a state diagram implemented by the TAP controller.

FIG. 3 illustrates the present invention using a JTAG TAP controller. As is well known in the art, the BIST routine resides in a CPU core 300, regardless of whether BIST is incorporated into microcode ROM or hardware in individual hardware units. A JTAG TAP controller 302 resides on the same chip 304 as the CPU core 300. The TAP controller 302 is a stand-alone module within the CPU chip 304. The TAP controller 302 includes a synchronous finite state machine 306 that implements the state diagram of FIG. 4. The TAP controller 302 includes a test clock input TCK that provides the clock for the test logic defined by the JTAG standard (IEEE 1149.1 Boundary-Scan Architecture). The dedicated TCK input ensures that test data can be moved to or from the chip 304 without changing the state of the on-chip system logic.

A test mode select input TMS is decoded by the TAP controller to control test operations. The signal presented at TMS is sampled by the state machine 306 on the rising edge of TCK. The value of TMS during successive clock cycles determines the path that the TAP controller follows through the state diagram of FIG. 4.

The TAP controller 302 also includes a test data input TDI and a test data output TDO. The TDI and TDO pins provide for serial movement of test data through the test circuit. Values presented at TDI are clocked into a selected instruction register 308 or one of a number of test data registers 310 of the TAP controller 302 on a rising edge of TCK. The contents of the selected instruction register or data register are shifted out of TDO on the falling edge of TCK through an output multiplexer 320.

An optional test reset input TRST provides for asynchronous initialization of the TAP controller. If TRST is included in the TAP, then the TAP controller is asynchronously reset to the TEST-LOGIC-RESET controller state of FIG. 4 when a logic zero is applied to TRST.

The present invention preferably provides a four bit "private" instruction denoted BISTPAT for setting the DFU flag. Those skilled in the art will recognize that the TAP controller hardware may be easily customized to execute so-called private instructions. The BISTPAT instruction inputted by first advancing to the SHIFT IR state by using the TCK and TMS signals as shown in the state diagram of FIG. 4. The state machine is cycled through the SHIFT IR state with TMS=0 to shift the four bits of the BISTPAT instruction into the instruction register 308. Using TMS and TCK, the state is then advanced to the UPDATE IR state in which the instruction shifted into the instruction register 308 is latched onto the parallel output of the shift register path of the instruction register. Once the instruction has been latched, it becomes the current instruction to be executed. The state is then advanced to the RUN-TEST/IDLE state in which the BISTPAT instruction is "executed" by the state machine 306 to set the DFU flag. The DFU flag may be stored in any register that is accessible to the BIST routine. For example, the DFU flag may be stored in the flag register file 322 of the CPU core 300 or as one bit in the standard register file (not shown) of the CPU core 300. Those skilled in the art will recognize that the standard TAP controller logic may be easily modified without undue experimentation to decode the BISTPAT instruction so as to set the DFU flag.

After setting the DFU flag, the state is advanced to the SHIFT-DR state, which is cycled through a predetermined number of cycles to serially read in the user-provided test pattern from TDI to a TAP data register 310. For example, the test pattern may be 32 bits long in current processors, requiring 32 cycles for the shift operation. After shifting the test pattern into the data register 310, the state is advanced to the UPDATE-DR state in which the test pattern is latched onto the parallel output of the data register 310. After the pattern is latched, the state machine 306 asserts the DATA_READY flag, which like the DFU flag, is stored in a flag register accessible to the BIST routine. Those skilled in the art will understand that the standard TAP controller logic can be easily modified without undue experimentation to set the DATA_READY flag when DFU is set and the test pattern is latched.

The data register 310 that stores the test pattern may act as a register BISTPATREG that is accessible to the BIST routine over an internal bus 324. Alternatively, BISTPATREG may reside in the core 300 and receive the test pattern over the bus 324 from the data register 310.

After the DFU and DATA_READY flags have been set and the test pattern stored in BISTPATREG, the user invokes the BIST routine through any means well known in the art, such as setting the Self-Test pin of the CPU or inputting and executing the RUNBIST instruction through the TAP interface (step 110).

The BIST routine of the present invention includes microcode or logic to implement the flow chart of FIG. 1B. After being invoked (step 110), the BIST routine checks whether the DFU flag is set (step 112). If it is, then BIST checks whether the DATA_READY flag is set (step 116). If that flag is also set, then the BIST routine performs its self-test using the test pattern from BISTPATREG (step 118) and eventually reports the results (step 120).

System Pin Approach

Figure 5:
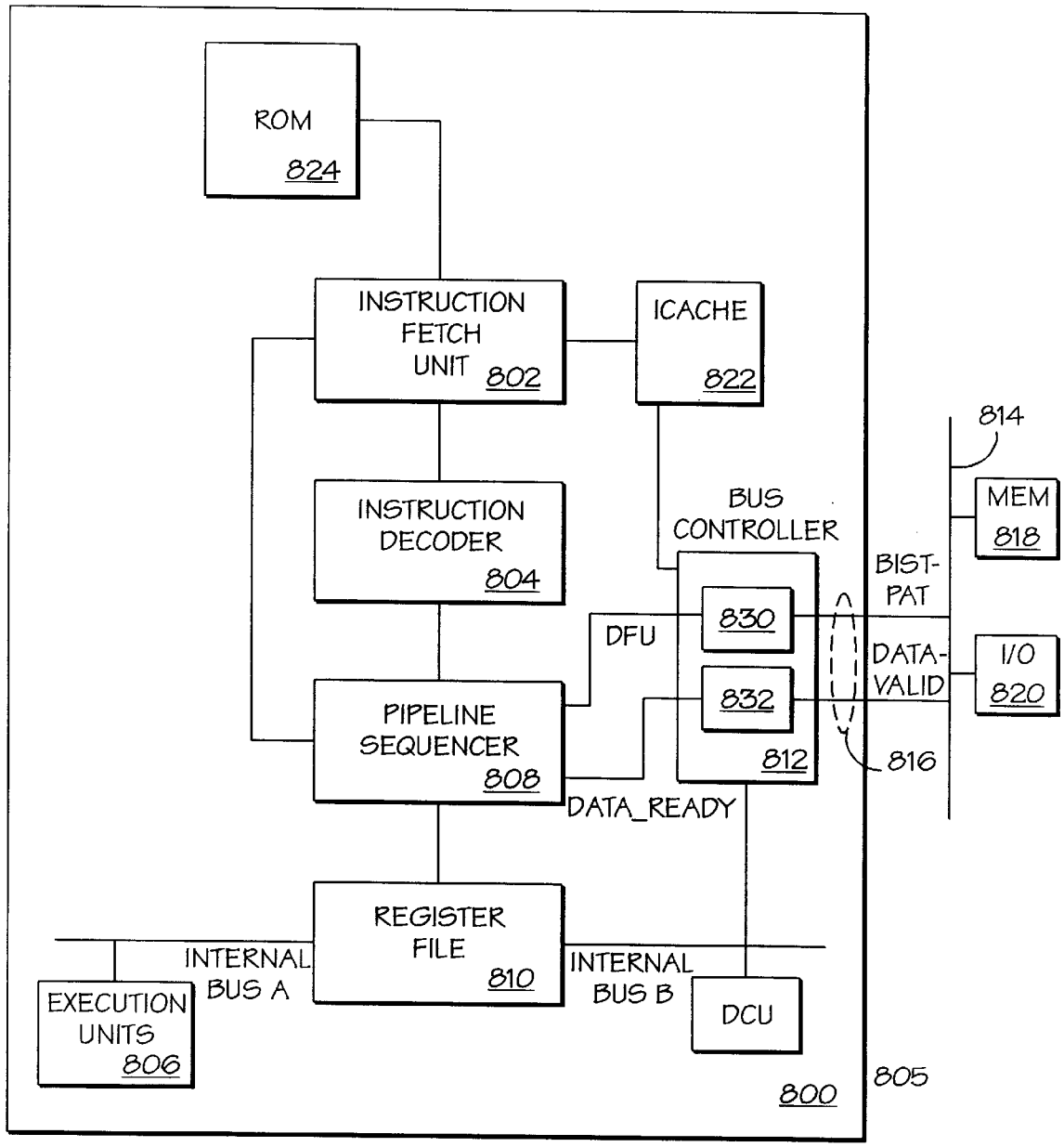
FIG. 5 illustrates a processor chip employing the system pin approach of the present invention.

FIG. 5 illustrates the implementation of interactive BIST using new chip pin signals. A processor chip 800 (such as the i960 processor manufactured by the assignee of the present invention) includes an instruction fetch unit (IFU) 802, an instruction decoder 804, a data cache 805, and several execution units 806. A pipeline sequencer 808 preferably controls the superscalar pipelining of decoded instructions to execution units coupled to internal bus A and execution units (not shown) coupled to internal bus B. The execution results from the execution units are stored in a register file 810. A bus controller 812 allows communication between on-chip units and a system bus 814 through system pins 816. The system pins 816 carry data, address and control signals to devices on the system bus 814, such as external memory 818 and I/O 820. Those skilled in the art will recognize that the system pin approach of the present invention is not limited to a microprocessor implementing the architecture of FIG. 5, but is applicable to any microprocessor architecture.

The instruction fetch unit 802 is coupled to an instruction cache 822 and a microcode ROM 824, a configuration well known in the art. The BIST routine preferably resides in the microcode ROM 824. As is well known in the art, the BIST routine may be invoked by asserting the Self-Test pin, which causes the pipeline sequencer 808 to update the instruction pointer to point to the first line of the BIST microcode in the ROM 824. The BIST microinstructions are sequentially fed from the IFU 802 to the decoder 804. In response, the decoder 804 sends control signals to the execution units 806 to cause the appropriate execution units to execute the BIST microcode.

Figure 6:
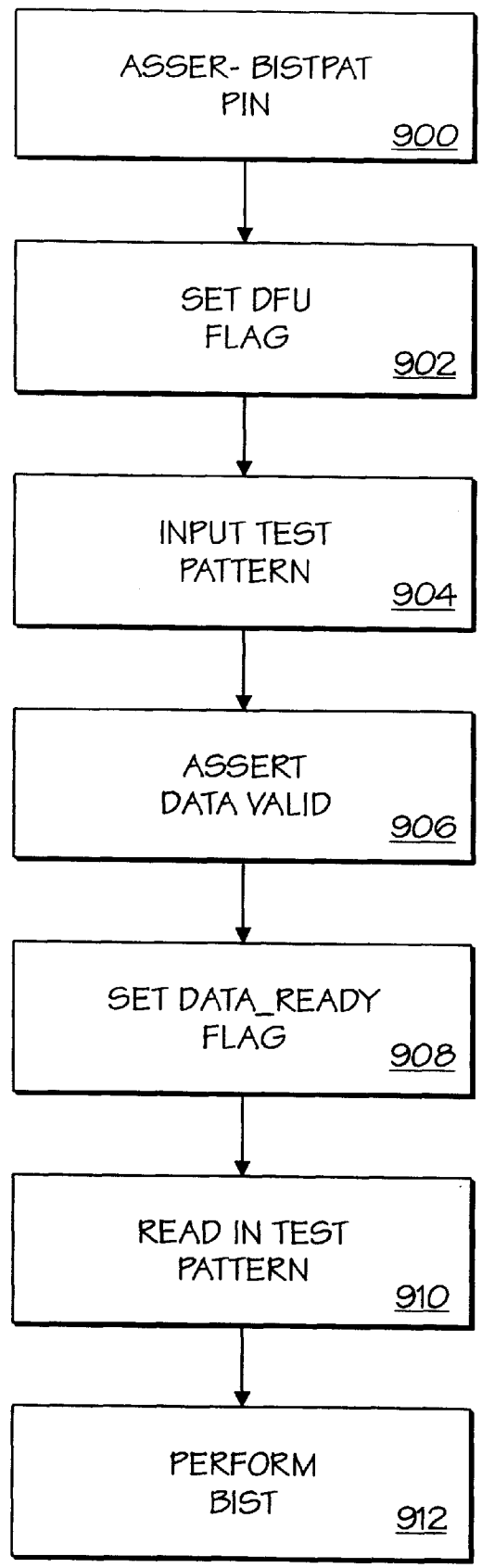
FIG. 6 is a flow chart diagramming the system pin approach of the present invention.

According to the present invention, the microprocessor chip 800 includes two pins (as part of the system pins 816) for implementing interactive BIST—BISTPAT and DATA-VALID. FIG. 6 illustrates a flow chart diagramming the operation of interactive BIST using the BISTPAT and DATAVALID pins. To initiate interactive BIST the BISTPAT pin is asserted (step 900). The assertion of BISTPAT sets a first latch 830, preferably located in the bus controller 812. Setting this latch sets the DFU flag (step 902). The DFU flag is preferably stored in a flag register (not shown) located in the pipeline sequencer 808. Alternatively, the flag may be stored as one bit in a register of the register file 810. The pipeline sequencer 808 of the present invention treats the set DFU flag as an event, causing the IFU 802 to initiate fetching from a BISTPAT microcode routine in microcode ROM.

The user inputs the test pattern onto the data pins (not shown) of the system pins 816 (step 904). The user then asserts a signal DATAVALID over the system pins 816 to indicate that the test pattern data input on the data bus is valid (step 906). The assertion of DATAVALID sets a second latch 832, preferably located in the bus controller 812. Setting this latch sets the DATA_READY flag (step 908). The DATA_READY flag is preferably stored in a flag register (not shown) located in the pipeline sequencer 808. Alternatively, the flag may be stored as one bit in a register of the register file 810.

The BISTPAT microcode tests the DATA_READY flag. If it is set, then the BISTPAT routine reads in the test pattern into a BIST-accessible register (step 910). Preferably, the microcode then branches to the BIST routine of the present invention (step 912). Alternatively, the user may invoke BIST externally through well-known techniques. The BIST routine of the present invention then tests the DFU and DATA_READY flags, as diagrammed in FIG. 1B, and performs self testing with the user-provided test pattern if those flags are set. After performing the self testing routine, the flags are reset as shown in FIG. 1B.

One skilled in the art will recognize that the BISTPAT microcode routine may be incorporated as part of a power-up or reset routine of the microprocessor, rather than being treated as a stand-alone module. Further, those skilled in the art will recognize that the BISTPAT routine, as well as the BIST routine itself, may be implemented in hardware as a state machine, rather than in microcode.

It will be appreciated that various modifications and alterations might be made by those skilled in the art without departing from the spirit and scope of the present invention. In particular, one skilled in the art will recognize that the BIST routine of the present invention may reside in microcode ROM or may be implemented in hardware attached to the processor units being tested. Further, the registers described herein need not be strictly implemented as registers, but can be implemented using any electronic storage element. The invention should therefore be measured in terms of the claims which follow:

What is claimed is:

1. A method for inputting an external user-programmable test pattern into a built-in self test (BIST) logic resident on an integrated circuit IC, the method comprising:

a) providing an external user-programmable test pattern to the IC, wherein the user-programmable test pattern inserts a new test pattern into the BIST logic;

b) storing the user-programmable test pattern in a test data storage element of a test access port (TAP), wherein the user-programmable test pattern is to be processed as test data by the BIST logic, and asserting a signal on a pin of the IC to indicate that the user-programmable test pattern is valid;

c) the TAP shifting a first instruction into an instruction storage element of the TAP and latching the first instruction to a parallel output of the instruction storage element; and d) executing the first instruction and shifting the test pattern into the test data storage element of the TAP and latching the test pattern to a parallel output of the test data storage element.

2. The method of claim 1, wherein the BIST logic is implemented as microcode stored in a microcode ROM on the IC.

3. The method of claim 1, wherein the BIST logic is implemented as a state machine integrated with an IC component to be tested.

4. In an integrated circuit (IC) including built-in self-test (BIST) logic resident on the IC, said IC exclusive of a JTAG pin, the BIST logic for executing a BIST routine for testing the IC, a method for inputting an external user-programmable test pattern into the BIST logic, the method comprising:

a) asserting a system pin of the IC to set a first flag indicating that the user-programmable test pattern will be provided to the IC, wherein the first flag is stored in a flag storage element accessible to the BIST logic;

b) providing the external user-programmable test pattern to the test interface over data pins of the IC, wherein the user-programmable test pattern inserts a new test pattern into the BIST routine;

c) storing the user-programmable test pattern in a test data storage element of a test access port (TAP), wherein the user-programmable test pattern is to be processed as test data by the BIST logic, and asserting a signal on a pin of the IC to indicate that the user-programmable test pattern is valid; and d) setting a second flag indicating that the user-programmable test pattern is available in the test data storage element, wherein the second flag is stored in a flag storage element accessible to the BIST logic e) the (TAP) advancing to a shift-IR state and shifting a first instruction into an instruction storage element of the TAP and advancing to an update-IR state and latching the first instruction to a parallel output of the instruction storage element; and f) advancing to a run-test state and executing the first instruction and advancing to a shift-DR state and shifting the test pattern into the test data storage element of the TAP and latching the test pattern to a parallel output of the test data storage element.

5. The method of claim 4, further comprising the steps of:

testing whether the first flag is set;

if the first flag is not set, executing the BIST routine using a predetermined test pattern internally generated on the IC;

if the first flag is set, executing the BIST routine using the user-programmable test pattern stored in the test data storage element.

6. In an integrated circuit (IC) including built-in self-test (BIST) logic, a method for inputting an external user-programmable test pattern into the BIST logic, the method comprising:

a) asserting a first pin of a set of system pins of the IC, said system pins coupled to a system bus and said system pin capable of transferring control signals between said IC and said system bus, said set of system pins exclusive a JTAG pin;

b) providing the user-programmable test pattern to the IC via system data pins coupled to the IC, wherein the user-programmable test pattern modifies the BIST logic;

c) storing the test pattern in a test data storage area accessible by the BIST logic to be processed by the BIST logic, and asserting a signal on a pin of the IC to indicate that the user-programmable test pattern is valid;

d) asserting a second pin of the set of system pins of the IC to set a flag indicating to a processor that the user-programmable test pattern is available in the test data storage area;

e) a test access port (TAP) advancing to a shift-IR state and shifting a first instruction into an instruction storage element of the TAP and advancing to an update-IR state and latching the first instruction to a parallel output of the instruction storage element; and f) advancing to a run-test state and executing the first instruction and advancing to a shift-DR state and shifting the test pattern into a test data storage element of the TAP and latching the test pattern to a parallel output of the test data storage element.

* * * * *